US009985416B2

(12) United States Patent
Capellini et al.

(10) Patent No.: US 9,985,416 B2
(45) Date of Patent: May 29, 2018

(54) CMOS-COMPATIBLE GERMANIUM TUNABLE LASER

(71) Applicant: IHP GmbH—Innovations for High Performance Microelectronics/Leibniz-Institut Fur Innovative Mikroelektronik, Frankfurt (DE)

(72) Inventors: Giovanni Capellini, Rome (IT); Christian Wenger, Berlin (DE); Thomas Schroder, Berlin (DE); Grzegorz Kozlowski, Cottbus (DE)

(73) Assignee: IHP GMBH—INNOVATIONS FOR HIGH PERFORMANCE MICROELECTRONICS—INSTITUT FUR INNOVATIVE MIKROELEKTRONIK, Frankfurt (DE)

( * ) Notice: Subject to any disclaimer, the term of this patent is extended or adjusted under 35 U.S.C. 154(b) by 0 days. days.

(21) Appl. No.: 14/377,032

(22) PCT Filed: Feb. 11, 2013

(86) PCT No.: PCT/EP2013/052702
§ 371 (c)(1),
(2) Date: Aug. 6, 2014

(87) PCT Pub. No.: WO2013/117768
PCT Pub. Date: Aug. 15, 2013

(65) Prior Publication Data
US 2015/0063382 A1    Mar. 5, 2015

(30) Foreign Application Priority Data
Feb. 10, 2012   (EP) ..................... 12154997

(51) Int. Cl.
*H01L 27/15* (2006.01)
*H01L 31/12* (2006.01)
(Continued)

(52) U.S. Cl.
CPC ............ *H01S 5/3201* (2013.01); *H01L 33/34* (2013.01); *H01S 5/021* (2013.01); *H01S 5/3223* (2013.01)

(58) Field of Classification Search
CPC ......... H01L 33/34; H01L 21/30; H01L 31/12; H01L 27/15; H01S 51/30
(Continued)

(56) References Cited

U.S. PATENT DOCUMENTS 6,194,256 B1 * 2/2001 Lee .................. H01L 21/84
257/E21.703
6,621,841 B1 * 9/2003 Soref .................. B82Y 20/00
257/13

(Continued)

OTHER PUBLICATIONS

X. Sun, et al; "Toward a Germanium Laser for Integrated Silicon Photonics;" IEEE Journal of Selected Topics in Quantum Electronics; vol. 16, No. 1; Jan./Feb. 2010; pp. 124-131.
(Continued)

*Primary Examiner* — Sheikh Maruf
(74) *Attorney, Agent, or Firm* — Ware, Fressola, Maguire & Barber LLP

(57) ABSTRACT

A semiconductor light emitter device, comprising a substrate, an active layer made of Germanium, which is configured to emit light under application of an operating voltage to the semiconductor light emitter device, wherein a gap is arranged on the substrate, which extends between two bridgeposts laterally spaced from each other, the active layer is arranged on the bridgeposts and bridges the gap, and wherein the semiconductor light emitter device comprises a
(Continued)

stressor layer, which induces a tensile strain in the active layer above the gap.

9 Claims, 4 Drawing Sheets

(51) Int. Cl.
*H01L 21/00* (2006.01)
*H01S 5/32* (2006.01)
*H01L 33/34* (2010.01)
*H01S 5/02* (2006.01)

(58) Field of Classification Search
USPC ...... 438/22, 197, 151; 257/13, 79–103, 918, 257/292, 347, 629
See application file for complete search history.

(56) References Cited

U.S. PATENT DOCUMENTS

| | | | | |
|---|---|---|---|---|
| 6,812,495 | B2* | 11/2004 | Wada | H01L 21/02381 257/103 |
| 6,949,761 | B2* | 9/2005 | Chu | H01L 29/66431 257/18 |
| 7,596,158 | B2 | 9/2009 | Liu et al. | |
| 2002/0117675 | A1* | 8/2002 | Mascarenhas | H01L 29/167 257/87 |
| 2003/0075725 | A1* | 4/2003 | Panajotov et al. | 257/99 |
| 2003/0104658 | A1* | 6/2003 | Furukawa | H01L 21/76262 438/151 |
| 2003/0168939 | A1* | 9/2003 | Talebpour | H01L 41/042 310/328 |
| 2004/0151222 | A1* | 8/2004 | Sekine | B82Y 20/00 372/43.01 |
| 2004/0232504 | A1* | 11/2004 | Lal et al. | 257/420 |
| 2004/0253792 | A1* | 12/2004 | Cohen | H01L 21/76264 438/400 |
| 2005/0082554 | A1* | 4/2005 | Torvik | B82Y 20/00 257/85 |
| 2005/0139753 | A1* | 6/2005 | Park | H01L 31/02161 250/214.1 |
| 2005/0145848 | A1* | 7/2005 | Mouli | H01L 27/148 257/72 |
| 2005/0184354 | A1* | 8/2005 | Chu | H01L 31/101 257/458 |
| 2005/0189589 | A1* | 9/2005 | Zhu et al. | 257/347 |
| 2006/0269693 | A1* | 11/2006 | Balseanu et al. | 427/569 |
| 2007/0105251 | A1* | 5/2007 | Liu | B82Y 20/00 438/22 |
| 2007/0262296 | A1* | 11/2007 | Bauer | H01L 31/105 257/19 |
| 2008/0272391 | A1* | 11/2008 | Kapur | H01L 31/105 257/103 |
| 2009/0140251 | A1* | 6/2009 | Yamazaki | H01L 21/67017 257/57 |
| 2010/0038689 | A1* | 2/2010 | Ahn | H01L 21/84 257/292 |
| 2010/0207254 | A1* | 8/2010 | Jain | H01L 31/105 257/629 |
| 2011/0012154 | A1* | 1/2011 | Okagawa et al. | 257/98 |
| 2011/0175047 | A1* | 7/2011 | Ramanathan et al. | 257/2 |
| 2012/0037881 | A1* | 2/2012 | Kim | H01L 33/007 257/13 |
| 2012/0318334 | A1* | 12/2012 | Bedell | H01L 21/02535 136/255 |
| 2012/0326766 | A1* | 12/2012 | Camillo-Castillo | H01L 29/66393 327/438 |
| 2013/0039664 | A1* | 2/2013 | Clifton | H01L 31/0352 398/200 |
| 2013/0052818 | A1* | 2/2013 | Shih | H01L 21/76811 438/653 |
| 2013/0240936 | A1* | 9/2013 | Seo | H01L 33/30 257/98 |
| 2015/0129836 | A1* | 5/2015 | Augusto | H01L 27/15 257/13 |

OTHER PUBLICATIONS

P.H. Lim, et al; "Enhanced Direct Bandgap Emission in Germanium by Micromechanical Strain Enginerring;" Optics Express; vol. 17, No. 18; Aug. 31, 2009; pp. 16358-16365.

X. Sun, et al; "Room-Temperature Direct Bandgap Electroluminescence from Ge-on Si Light-Emitting Diodes;" Optics Letters; vol. 34, No. 8; Apr. 15, 2009; pp. 1198-1200.

* cited by examiner

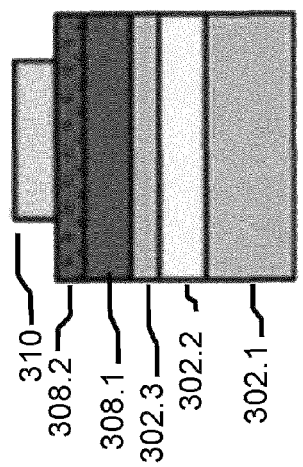 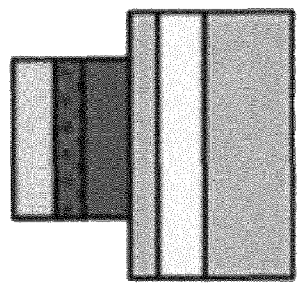 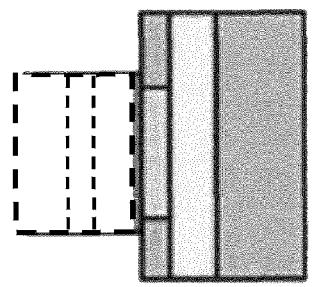 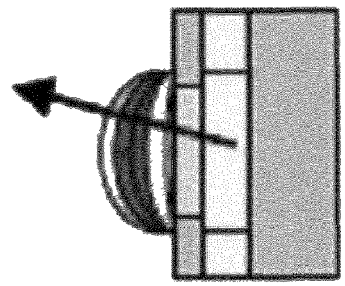
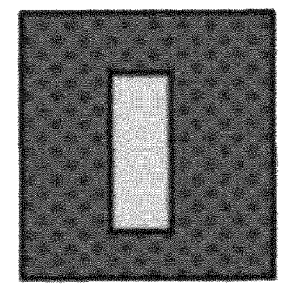 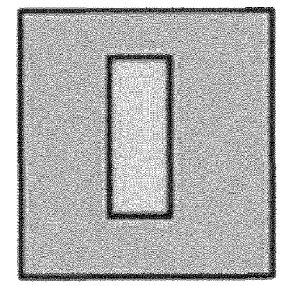 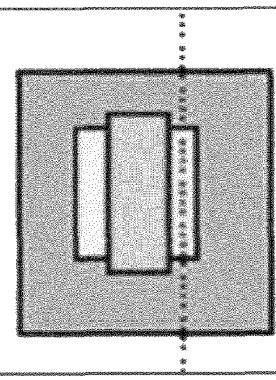 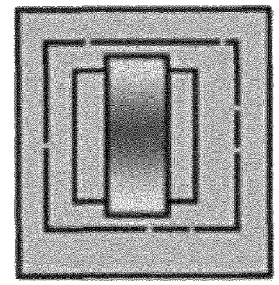
Fig. 3E    Fig. 3F    Fig. 3G    Fig. 3H

CMOS-COMPATIBLE GERMANIUM TUNABLE LASER

CROSS REFERENCE TO RELATED APPLICATIONS

This application is the U.S. National Stage of International Application Number PCT/EP2013/052702 filed on Feb. 11, 2013 which application claims priority under 35 USC § 119 to European Patent Application No. 12154997.6 filed on Feb. 10, 2012. Both applications are hereby incorporated by reference in their entirety.

TECHNICAL FIELD

The present invention relates to semiconductor light emitter devices, in particular, a CMOS-compatible light emitter device.

BACKGROUND OF THE INVENTION

An efficient electrically-pumped light emitter integrated in the standard CMOS technology has been so far the Holy Grail of the monolithic electronic-photonic integration. As a matter of fact, rapid advances in Si photonics over the last decade have enabled mass production of higher-functionality and lower-cost photonic integrated circuits, in which all the active and passive components such as waveguides, couplers, modulators, photodetectors, etc., except for the light source, can be fabricated side by side with both digital and analog circuitry in a silicon CMOS foundry. The obvious main advantages of a fully integrated light source are cost reduction, yield, easing of the packaging, link-budget improvement and a consequent power consumption reduction.

Among the different pathways leading to the on-chip integration of the light source, epitaxial lasers on silicon comprising active regions based on III-V or SiGe heterostructures have attracted a wide interest. In particular, Ge heteroepitaxial layers on Si are very promising since key photonic components for this material system, including high speed detectors and modulators, have been successfully integrated in standard CMOS process flow. Thus, Ge is now a "fab"-compatible material produced by means of fully qualified production processes and is considered one of the most promising materials for "more than Moore" device development.

An optically pumped Ge-on-Si laser demonstrating continuous-wave (cw) operation at room temperature has already been fabricated, as reported by J. Liu et al. Optics Letters 35, 679 (2010). In this approach, although Ge has an indirect band gap, the authors exploit a tensile strain in the Ge layer caused by a difference in thermal expansion coefficients between the Ge layer itself and the silicon substrate and accumulated during the fabrication process. Strain ε is defined as $$\varepsilon = \frac{a-a_0}{a_0},$$

wherein a denotes the lattice constant of the strained lattice and $a_0$ denotes the lattice constant of the unstrained lattice of the solid state material under consideration. Moderate strain of the order of 0.2% was reported sufficient to reduce the energy difference between the Γ and L valleys in the conduction band of the energy band structure of Germanium. Free electrons, incorporated through n-type doping, can fill up the low-lying L valley so that injected electrons do not thermalize at L but at Γ, being thus available for radiative recombination through a direct transition.

The net gain is determined by the competition between this optical gain enhancement and the optical loss from additional free carrier absorption. In optically pumped bulk-Ge lasers, using a very high level of doping of $8 \times 10^{19}$ cm$^{-3}$, a net optical gain as high as 500 cm$^{-1}$ could be achieved, as reported by X. Sun et al. IEEE J. of Sel. Topics in Quantum Electr. 16, 124 (2010).

The presence of a thermal tensile strain of 0.2% can double such a value. However the maximum reported gain for highly doped, thermal tensile strained structures is 50 cm$^{-1}$, owing to the difficulties in to real high- and ultra-high n-doping in Ge due to donor solubility, dopant activation, and material processing. Therefore P. H. Lim et al., Optics Express 17, 16358 (2009), proposed to reduce the need of high-doping levels by externally increasing the tensile strain in the Ge epi-layer using micromechanical engineering.

SUMMARY OF THE INVENTION

A first aspect of the present invention a Ge-based light emitter structure that is CMOS compatible.

Another aspect of the present invention is a CMOS compatible process enabling the fabrication of a Ge-based LED/Laser.

According to the first aspect of the present invention, a semiconductor light emitter device is provided, comprising
 a substrate;
 an active layer made of Germanium, which is configured to emit light under application of an operating voltage to the semiconductor light emitter device; wherein
 a gap is provided, which extends between two bridgeposts arranged on the substrate and laterally spaced from each other;
 the active layer is arranged on the bridgeposts and bridges the gap, and wherein
 the semiconductor light emitter device comprises a stressor layer, which induces a tensile strain in the active layer above the gap.

The semiconductor light emitter device of the present invention provides an innovative concept for a CMOS-compatible, electrically driven Ge-based LED or laser structure.

The device is based on the recognition that the Ge active layer may be shaped as an air bridge that is under the influence of a stressor layer. The action of the stressor layer is to induce a tensile stress in the Ge active layer.

As a consequence of the tensile strain, the electronic energy bands are modified in a way that the radiative recombination of electron-hole pairs is enhanced in comparison to the Ge bulk case. Moreover, the energy-band gap is shrunk in comparison with that of unstrained Ge. As a consequence, the light emission efficiency of the material is increased, with the emission occurring at a wavelength increasing with the amount of tensile strain.

As will be disclosed in the context of the description of preferred embodiments, the light emitter device of the present invention forms an advantageous device platform that allows adding tuning elements, which enable a tuning of the emitted wavelength by strain adjustment, either fixed via proper selection of the stressor material, or even variable under operation of the device via an electrical control.

In accordance with a second aspect of the present invention, a process for fabricating a light emitter comprises
providing a substrate;
fabricating an active layer made of Germanium, which is configured to emit light under application of an operating voltage to the semiconductor light emitter device,
fabricating a gap on the substrate, which extends between two bridgeposts laterally spaced from each other; wherein
the active layer is fabricated so as to bridge the gap between the bridgeposts, and wherein
a stressor layer is fabricated, which induces a tensile strain in the active layer above the gap.

In the following, embodiments of the above two aspects of the invention will be described. The additional features distinguishing the different embodiments can be combined to obtain further embodiments.

The following specification first turns to embodiments of the light emitter device of the first aspect of the invention.

The active layer bridging the gap is preferably arranged as an outer layer of the bridge in order to allow inducing the tensile strain. Whether the bridge above the gap is bent upward (away from the substrate) or downward (towards the substrate) is a matter of processing options and photonic design. Both alternatives form respective embodiments of the light emitter device of the present invention.

A Ge light emitting diode (LED) or laser diode (LD) in accordance with the present invention is preferably configured as a lateral p-i-n diode operating under forward bias condition. Electrical contacts to the Ge microbridge structure are preferably arranged laterally with respect to the active layer, i.e., when the structure is displayed in a cross-sectional view as in FIG. 1, in areas to the left and right of the active layer. In those lateral areas heavy p and heavy n-doping is preferably applied.

The electrical contacts from the side areas may for instance be made of poly-Si or a germanide of a metal, such as Co, Ni, Ti. Also W metal contacts could be used as direct contacts to Ge.

The active layer bridging the gap between the bridgeposts is herein also referred to as a microbridge. The part of the microbridge structure with highest strain is preferably of intrinsic conductivity and configured for efficient light emission by direct recombination.

The spatial separation of the high doping areas and the light emission area brings about key advantages. These include a low free-carrier absorption and a low Auger recombination. Furthermore, due to a lowering of the conduction band minimum and an increase of the valence band maximum in energy under tensile strain, electrons as well as holes will drift to the highly strained intrinsic part and, due to this local confinement by band gap engineering, be available for efficient direct recombination and light output.

The light output at the desired wavelength can be further enhanced by the presence of a photonic crystal design in the intrinsic, highly tensile strained part of the Ge microbridge structure.

Preferably, the tensile strain in the active layer is more than 1%, in other embodiments even above 2%. Increasing the tensile strain to this level induces a band gap shrinkage and a further shift of the $\Gamma$ and L conduction bands, which in turn progressively decrease their energy distance, eventually leading to a cross-over toward a "direct-type" gap.

Such a high level of strain allows reaching a net gain value as high as 2000 cm$^{-1}$ with doping levels even below $2\times10^{19}$ cm$^{-3}$, for instance as low as $8\times10^{18}$ cm$^{-3}$. This is a much easier-to-achieve donor density. This preferred decrease of the requested donor density in the present embodiment has another beneficial effect. As a matter of fact, below the of $2\times10^{19}$ cm$^{-3}$ limit, the gain is expected to increase with the operating temperature with a gain maximum achieved at 350 K, i.e., at a temperature very close to the on-chip temperature in standard CMOS devices.

Nonetheless, other, in particular higher doping levels can be used in other embodiments to partially compensate the strain-induced band gap shrinkage to maximize the optical gain at a desired emission wavelength.

In some embodiments, the substrate is a silicon-on-insulator substrate having a top silicon layer on an intermediate insulator layer, which is arranged on a carrier substrate, and wherein the gap reaches through the top silicon layer. The carrier substrate may be made of any material that meets mechanical and electrical requirements of the device and of the processing technology to be used in fabrication of the device. Silicon is a suitable carrier in particular in the context of a CMOS fabrication process.

In one embodiment of the invention the static stressor is a dielectric or a dielectric layer stack deposited on the active Ge layer. The stress in the stressor layer induces a tensile strain in to the Ge active layer.

In one type of embodiments, the stressor layer either comprises or consists of a material layer deposited immediately on the active layer. In these embodiments, a layer stack comprising the active layer and the stressor layer may forms the air bridge that bridges the gap between the bridgeposts. The material choice of the stressor layer depends on the desired tensile strain that is to be induced. The dielectric layer can for instance comprise SiN, SiON, or Silicon-rich SiON. One skilled in the art can find other suitable materials for the stressor layer based on these examples. An example of a suitable material for inducing a tensile stress of more than 1% is silicon nitride. The strain level may be adjusted by an appropriate choice of the thickness of the stressor layer, its composition and deposition conditions.

In another embodiment, the stressor layer comprises an electrically tunable layer, which is configured to induce the tensile strain or a tensile strain component in the active layer upon electrical actuation of the tuning layer. Suitable tuning layers include a bimorph, that is, a layer stack of a piezoelectric material and a metal. The piezoelectric material is in one embodiment in contact with the active layer.

An actuation, that is, application of an electric field to the bimorph, causes the piezoelectric layer to extend and the metal to contract, which will induce a bow in the active layer that creates strain. This strain adds to the strain created by the stressor layer.

In one embodiment, the voltage-dependent piezoelectric response of the bimorph is transformed into a strain tuning range of the active layer, thus creating to a tuning range of the wavelength of emitted light in response to a voltage range of a tuning voltage applied to the bimorph. In this embodiment the tensile strain can be micromechanically tuned and the density of active dopants can be selected in a wide range of concentrations.

Examples of suitable piezoelectrics are ZnO and/or AlN, Different embodiments have the piezoelectric layer in polycrystalline or epitaxially grown form.

In another embodiment, the stressor layer consists of the tuning layer.

The stressor layer is in an alternative embodiment arranged remotely from the active layer. For instance, the stressor layer may be arranged with only indirect mechanical contact to the active layer, in particular below the active layer.

A preferred embodiment of the process for fabricating a semiconductor light emitter device in accordance with the second aspect of the invention comprises providing the substrate comprises providing a silicon-on-insulator substrate having a top silicon layer on an intermediate insulator layer, which is arranged on a carrier substrate, wherein subsequently the active layer and the stressor layer are deposited on the top silicon layer and laterally etched to define a device layer stack;

a lateral access for an etchant to the top silicon layer and to the insulator layer is fabricated;

the top silicon layer and the insulator layer underneath the device layer stack are partially removed by applying the etchant, thus forming the gap.

This CMOS-compatible processing enables a cost-efficient fabrication of the light emitter device in large volumes in the context of standard processing techniques.

BRIEF DESCRIPTION OF THE DRAWINGS

In the following, additional embodiments will be described with reference to the enclosed Figures.

FIGS. 3A to 3H show schematic top and cross sectional views of a light emitter device during different stages of an embodiment of a fabricating process;

DETAILED DESCRIPTION

Figure 1:
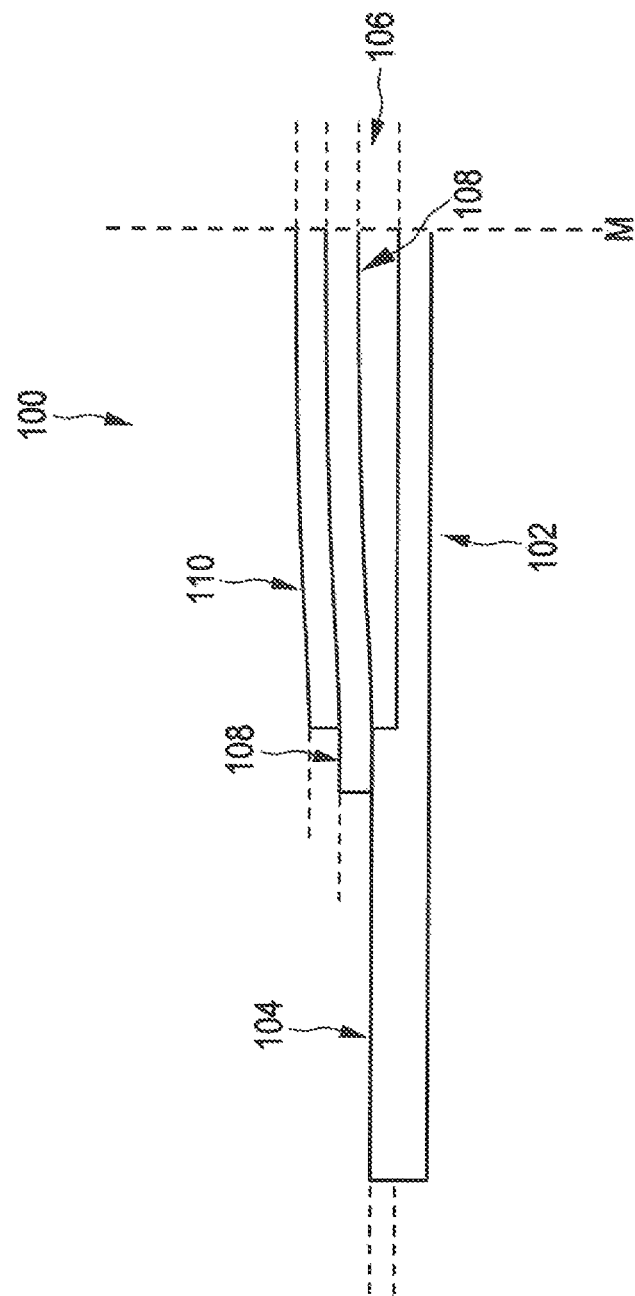
FIG. 1 shows a schematic cross sectional view of an embodiment of a light emitter device.

FIG. 1 shows a schematic cross sectional view of an embodiment of a light emitter device 100. The graphical representation of FIG. 1 is simplified in that only a lateral section of the device is shown. However, since the device is symmetrical, the parts not shown do not contain structural features differing from those shown in the Figure. The symmetry is of mirror type, and the position of the mirror plane M, which extends perpendicularly to the cross-sectional plane of FIG. 1, is indicated at the right edge of FIG. 1. Horizontal dotted lines at the left and right edges of the layer structure are provided to more clearly show the respective position and thickness of the individual layers in layer structure of the light emitter device 100. A further simplification of the graphical representation in FIG. 1 is that only structural elements are shown, which are essential to understand the structure of the present embodiment. In particular, no contact structures are shown.

In the embodiment of FIG. 1, a Si substrate 102 is patterned to exhibit a bridgepost 104 formed by a surface section of the substrate 102, and a gap 106 formed by a shallow trench in the substrate 102. An active layer 106 made of Ge is arranged on the bridgepost 104. An active layer 108 is covered by a dielectric stressor layer 110, made for instance of SiN. The active layer 108 is made of intrinsic Germanium, and highly doped p- and n-type layers (not shown) are arranged to the left and right of the active layer, respectively, so as to form a lateral p-i-n structure.

The effect of the stressor layer 110 is to stress and bend the underlying active layer 108. In this way the electronic energy bands of Ge in the active layer 108 are modified in a way that the radiative recombination of electron-hole pairs is enhanced respect to the Ge bulk case, as described above in more detail. Moreover the energy-band gap of Ge is shrunk. As a consequence the light efficiency of the active layer 108 is increased, with the emission occurring at a wavelength increasing with the amount of tensile strain set.

Figure 2:
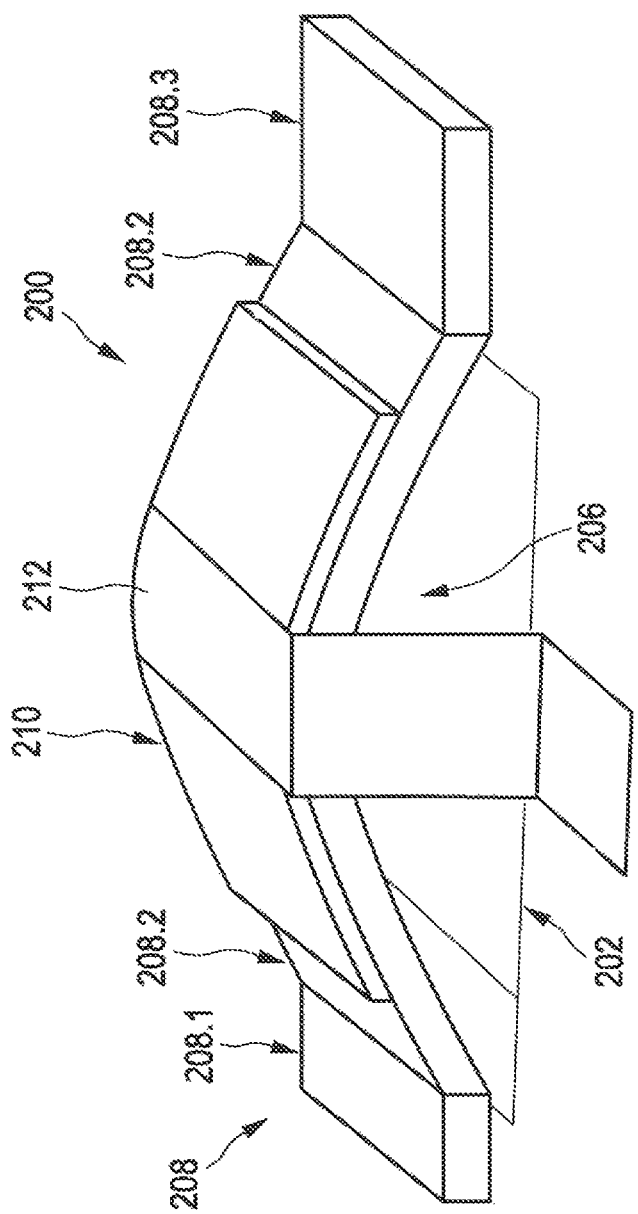
FIG. 2 shows a schematic perspective view of another embodiment of a tunable light emitter device

FIG. 2 shows a schematic perspective view of another embodiment of a tunable light emitter device. Reference labels used in FIG. 2 correspond to those used in FIG. 1 for corresponding structural elements, except for the first digit, which is a "2" in FIG. 2 and a "1" in FIG. 1.

The embodiment of FIG. 2 is based on the same structural principle as the embodiment of FIG. 1. In FIG. 2, the active layer 208 is shown to have three sections 208.1, 208.2, and 208.3. The active layer sections 208.1 and 208.3 are arranged on respective bridgeposts (not shown), and the active layer section 208.2 spans the gap 206 between the active layer 208 and the substrate 202 only a surface section of substrate 202 in the region of the gap 206 is indicated schematically in FIG. 2.

On top of the active layer 208, the stressor layer 210 is arranged, in a similar manner as in the embodiment of FIG. 1. However, in the present embodiment, the stressor layer is made of a piezoelectric in order to allow a tuning of the stress exerted by stressor layer 210 on the active layer 208. To this end, a contact layer 212 is deposited on a section of the stressor layer 210 and allows an application of a tuning voltage. The contact layer is made of a metal and has some resilience to accommodate the amount of motion in the microbridge structure created by the piezoelectric effect under application of a tuning voltage to the stressor layer 210 via the contact layer 212.

The influence of the piezoelectric effect, if a tuning voltage is applied, the stress in the active layer increases or reduces to some extent in comparison with the absence of a tuning voltage. This way, the band gap of Ge can be influenced and thus the wavelength of the emitted light under application of an operating voltage across the p-i-n structure can be tuned.

In another variant that is not shown, a second electrically actuated stressor (bimorph layer) can be deposited on top of a steady stressor layer (e.g., SiN). The purpose of this second stressor is much like that of the embodiment of FIG. 2, namely, to modulate the strain in the Ge layer via an external bias. In this way the user can tune the emitted light frequency over a band centred around the zero-field emission. Enclosed in a suitable photonic structure (e.g. external cavity), this material can be the active layer in a tunable NIR/MIR Laser.

FIGS. 3A to 3H show schematic cross-sectional and top views of a light emitter device during different stages of an embodiment of a fabricating process. The cross sectional views are shown in the respective upper part of the Figures, and the op view, are shown in the respective lower part of the Figures.

The present process is CMOS-compatible. It is performed starting from an SOI substrate 302 (FIG. 3A), having a carrier layer 302.1, for instance made of silicon, an insulator layer 302.2, for instance made of silicon dioxide, and a silicon top layer 302.3.

Figure 3D:
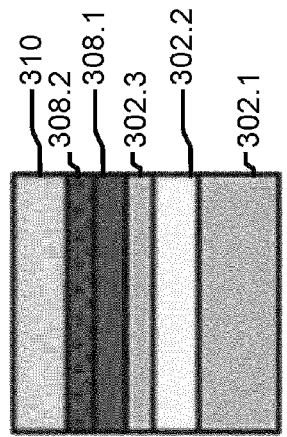
Figure 3D:
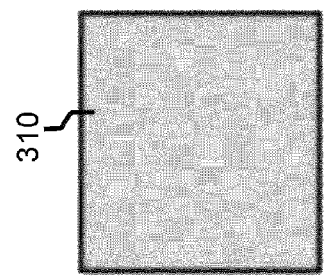
Figure 3C:
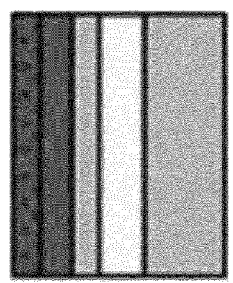
Figure 3C:
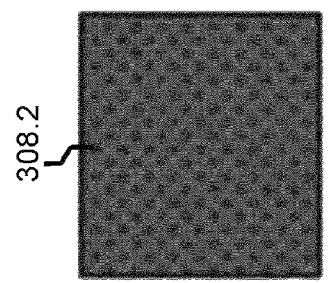
Figure 3B:
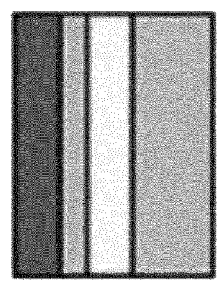
Figure 3B:
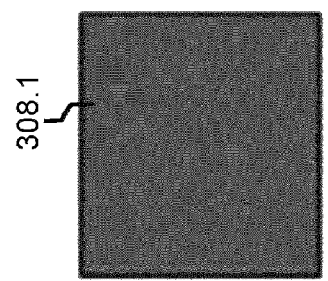
Figure 3A:
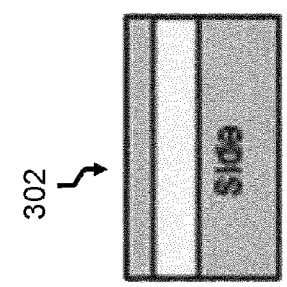
Figure 3A:
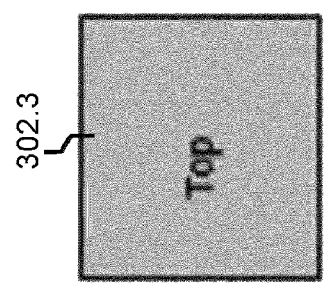

On the SOI substrate 302, an intrinsic Germanium layer 308.1 (FIG. 3B) and a doped Germanium layer 308.2 (FIG. 3C) are deposited, which later form an active layer structure 308. On top, a stressor layer 310 is deposited (FIG. 3D).

Subsequently, patterning starts with the stressor layer, which is selectively removed, leaving only a stripe-shaped section (FIG. 3E). An etching step performed in the context this processing step does not attack the underlying active layer structure 308. This is only patterned in a subsequent processing step, to the same stripe shape, as shown in FIG. 3F. This step is performed selectively and does not attack the previously patterned stressor layer or the underlying silicon top layer 302.3 of the SOI substrate 302.

Subsequently, the top substrate layer 302.3 is patterned by fabrication a shallow trench opening, as shown in FIG. 3G. The cross-sectional view of FIG. 3G is in a plane indicated by a dotted line in the corresponding top view underneath. For that reason, the active layer and the stressor layer are shown in a dashed contour only. Finally, an underetch is performed removing a section of the insulator layer 302.2. At the end of this process, the layer structure of the active Ge layer 308.1, the doped Ge layer 308.2 and the stressor layer is bent due to the tensile stress exerted by the stressor layer, and due to the gap formation.

The invention claimed is:

1. A semiconductor light emitter device, comprising
a substrate;
an active layer made of Germanium, which is configured to emit light under application of an operating voltage to the semiconductor light emitter device, wherein
a gap is arranged on the substrate, which extends between two bridgeposts laterally spaced from each other;
the active layer is arranged on the bridgeposts and bridges the gap,
the semiconductor light emitter device comprises a stressor layer, which induces a tensile strain in the active layer above the gap,
the stressor layer comprises an electrically actuatable tuning layer, which is configured to induce the tensile strain or a tensile strain component in the active layer upon electrical actuation of the tuning layer, and
the active layer is tunable over a limited range of strain values in dependence on an amount of an actuation voltage.

2. The light emitter device of claim 1, wherein the substrate is a silicon-on-insulator substrate having a top silicon layer on an intermediate insulator layer, which is arranged on a carrier substrate, and wherein the gap reaches through the top silicon layer.

3. The light emitter device of claim 1, wherein the stressor layer either comprises or consists of a material layer deposited immediately on the active layer.

4. The light emitter device of claim 3, wherein the stressor layer either comprises or consists of a silicon nitride layer.

5. The light emitter device of claim 1, wherein the stressor layer is arranged below the active layer, that is, closer to a carrier substrate than the active layer.

6. The light emitter device of claim 2, wherein the active layer comprises an n-doped Ge layer having a donor concentration below $2 \times 10^{19}$ cm$^{-3}$.

7. The light emitter device of claim 1, forming a lateral p-i-n diode, wherein the active layer forms the intrinsic semiconductor layer of the p-i-n diode.

8. A method for fabricating a light emitter device, comprising,
providing a substrate;
fabricating an active layer made of Germanium, which is configured to emit light under application of an operating voltage to the semiconductor light emitter device,
fabricating a gap on the substrate, which extends between two bridgeposts laterally spaced from each other; wherein
the active layer is fabricated so as to bridge the gap between the bridgeposts, and wherein
fabricating a stressor layer, which induces a bow in the active layer that is indicative of a tensile strain present in the active layer above the gap, wherein fabricating the stressor layer comprises fabricating an electrically actuatable tuning layer, which is configured to induce the tensile strain or a tensile strain component in the active layer upon electrical actuation of the tuning layer.

9. The method of claim 8, wherein
providing the substrate comprises providing a silicon-on-insulator substrate having a top silicon layer on an intermediate insulator layer, which is arranged on a carrier substrate, wherein subsequently
the active layer and the stressor layer are deposited on the top silicon layer and laterally etched to define a device layer stack;
a lateral access for an etchant to the top silicon layer and to the insulator layer is fabricated;
the top silicon layer and the insulator layer underneath the device layer stack are partially removed by applying the etchant, thus forming the gap.

* * * * *